(12) United States Patent
Sasaki et al.

(10) Patent No.: US 7,934,966 B2
(45) Date of Patent: May 3, 2011

(54) LIGHT-TRANSMITTING ELECTROMAGNETIC WAVE SHIELDING FILM AND PROCESS FOR PRODUCING THE SAME

(75) Inventors: Hirotomo Sasaki, Minami-ashigara (JP); Ryo Nishizakura, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 819 days.

(21) Appl. No.: 11/630,354

(22) PCT Filed: Jun. 22, 2005

(86) PCT No.: PCT/JP2005/011868
§ 371 (c)(1),
(2), (4) Date: Sep. 10, 2007

(87) PCT Pub. No.: WO2006/001461
PCT Pub. Date: Jan. 5, 2006

(65) Prior Publication Data
US 2008/0211371 A1  Sep. 4, 2008

(30) Foreign Application Priority Data

Jun. 23, 2004 (JP) .................................. 2004-184435

(51) Int. Cl.
*H01J 9/24* (2006.01)
(52) U.S. Cl. ........... 445/24; 313/582; 313/587; 313/112
(58) Field of Classification Search .......... 313/582–587, 313/112; 445/24–25
See application file for complete search history.

(56) References Cited

U.S. PATENT DOCUMENTS

| | | | |
|---|---|---|---|
| 6,307,671 B1* | 10/2001 | Yabuki ........................ | 359/361 |
| 6,532,120 B1* | 3/2003 | Harada et al. .................. | 359/885 |
| 6,982,023 B2 | 1/2006 | Wachi et al. | |
| 2002/0017636 A1* | 2/2002 | Harada et al. .................. | 252/582 |
| 2002/0171606 A1* | 11/2002 | Yabuki ........................... | 345/37 |
| 2003/0102790 A1 | 6/2003 | Wachi et al. | |
| 2004/0229028 A1* | 11/2004 | Sasaki et al. .................. | 428/220 |
| 2005/0151454 A1* | 7/2005 | Yabuki .......................... | 313/112 |

FOREIGN PATENT DOCUMENTS

| | | |
|---|---|---|
| CN | 1422112 A | 6/2003 |
| EP | 0889357 A1 | 1/1999 |
| EP | 1553212 A1 | 7/2005 |
| JP | 2-46800 A | 2/1990 |
| JP | 2000-149773 A | 5/2000 |
| JP | 2003-29022 A | 1/2003 |
| JP | 2003-168887 A | 6/2003 |
| JP | 2004-103701 A | 4/2004 |
| JP | 2004-172041 A | 6/2004 |
| JP | 2004-172554 A | 6/2004 |
| JP | 2004-281684 A | 10/2004 |
| WO | WO 2004/007810 A1 | 1/2004 |

OTHER PUBLICATIONS

Supplementary European Search Report for Application No. 05755394.3 dated Aug. 31, 2010.
Korean Office Action for Application No. KR-2007-7001276, dated Jul. 29, 2010.

* cited by examiner

*Primary Examiner* — Bumsuk Won
*Assistant Examiner* — Kevin Quarterman
(74) *Attorney, Agent, or Firm* — Birch, Stewart, Kolasch & Birch, LLP

(57) ABSTRACT

A light-transmitting electromagnetic wave shielding film which is a conductive silver thin film with a metallic silver portion formed on a support in a meshy state, wherein the metallic silver portion formed in the meshy state has a line width of 18 μm or less, an opening rate of 85% or more, an Ag content of 80 to 100% by mass and a surface resistance value of 5 Ω/sq or less. This light-transmitting electromagnetic wave shielding film has characteristic features that it has a high electromagnetic wave shielding property and a high transparency at the same time and the meshy portion is black.

16 Claims, No Drawings

LIGHT-TRANSMITTING ELECTROMAGNETIC WAVE SHIELDING FILM AND PROCESS FOR PRODUCING THE SAME

TECHNICAL FIELD

The present invention relates to a light-transmitting electromagnetic wave shielding film being an electromagnetic wave shielding material which shields an electromagnetic wave generated from a display surface of CRT (cathode ray tube), PDP (plasma display panel), liquid crystal, EL (electroluminescence), FED (field emission display) or the like, an electronic oven, electronic appliances, a printed circuit board and the like and which has a transparency, a process for producing the same, a light-transmitting electromagnetic wave shielding film for a plasma display panel and a plasma display panel.

BACKGROUND ART

In recent years, with the increasing use of various electric installations and electronic installations, electromagnetic interference (EMI) has been rapidly increased. It has been indicated that EMI causes malfunction or troubles of electronic and electric appliances and further gives disorders to operators of these appliances. Accordingly, for electronic and electric appliances, it has been required to control the intensity of released electromagnetic wave within standards or regulations.

To cope with EMI, there is a need to shield an electromagnetic wave. For this purpose, it is self-evident that a property of a metal that does not pass the electromagnetic wave may be used. For example, a method in which a case is formed with a metallic product or a highly conductive product, a method in which a metallic plate is inserted between circuit substrates, a method in which a cable is covered with a metallic foil, and the like have been employed. However, since an operator has to recognize characters and the like displayed on a screen in CRT, PDP and the like, a transparency is required for a display. Accordingly, the foregoing methods have been inappropriate as a method for shielding an electromagnetic wave because the display surface is often non-transparent.

Especially, PDP generates large quantities of an electromagnetic wave in comparison with CRT and the like, so that a stronger electromagnetic wave shieldability is required. An electromagnetic wave shieldability can simply be expressed in terms of a surface resistance value. For example, in a light-transmitting electromagnetic wave shielding material for CRT, the surface resistance value is required to be approximately 300 $\Omega$/sq or less, whereas in a light-transmitting electromagnetic wave shielding material for PDP, it is required to be 2.5 $\Omega$/sq or less. In a plasma television for people's livelihood using PDP, it is highly required to be 1.5 $\Omega$/sq or less, more preferably 0.1 $\Omega$/sq or less. Thus, quite a high conductivity is required.

Regarding a level required for a transparency, a transmittance in the entire visible region is required to be approximately 70% or more for CRT and 80% or more for PDP. Thus, a still higher transparency is desired.

For solving the problems, various materials and methods have been so far proposed in which both of the electromagnetic wave shielding property and the transparency are satisfied using a metallic mesh having an opening portion, as will be described below.

(1) Mesh with a Silver Paste Printed

For example, a method in which a paste made of a silver powder is printed in a network state to obtain a silver mesh is disclosed (refer to, for example, gazette of JP-A-2000-13088). The silver mesh obtained by this method is problematic in that a line width is large to decrease a transmittance because of a printing method, or the like. Further, a surface resistance value is large and an electromagnetic wave shieldability is low. For this reason, there was a need to plate the resulting silver mesh for increasing the electromagnetic wave shieldability.

(2) Irregular Network-Like Silver Mesh

For example, an irregular micro-network-like silver mesh and a method for producing the same are disclosed (refer to, for example, gazette of JP-A-10-340629). However, this method is problematic in that only a mesh with a large surface resistance value of 10 $\Omega$/sq (low electromagnetic wave shieldability) is obtained. Further, it is problematic in that a haze is as large as more than 10-odd % to dim a display image.

(3) Etched Copper Mesh Using Photolithography

A method in which a copper foil is etched using photolithography to form a copper mesh on a transparent substrate is proposed (refer to, for example, gazette of JP-A-10-41682). This method is advantageous in that since fine processing of a mesh is possible, a mesh with a high opening rate (high transmittance) can be produced and strong electromagnetic wave release can also be blocked. However, the method is problematic in that it includes quite a large number of steps and production has to be conducted through these steps.

Further, since the copper foil is used, the final mesh shows not a black color but a color of the copper foil to cause the decrease in contrast of an image in a display device. Still further, owing to the etching method, there is a problem that an intersecting portion of a lattice pattern is thicker than a line of a linear portion and its improvement is required in relation to a problem of moire.

(4) Method for Forming Conductive Silver Using a Silver Salt

In the 1960s, a method in which a metallic silver thin film pattern having a conductivity is formed by a silver salt diffusion transfer method for depositing silver on a physical development nucleus has been disclosed (refer to, for example, gazette of JP-B-42-23746).

However, an approach in which an electromagnetic wave released from an image display surface of a display of CRT, PDP or the like is shielded by making a conductive metallic silver thin film through this method without disturbing image display was entirely unknown.

According to this method, a silver thin film of 10 $\Omega$/sq to 100 $\Omega$/sq is obtained, but this level of the conductivity is insufficient for use in PDP. Moreover, a transparency is also insufficient, so that there is a problem that the transparency and the conductivity cannot be satisfied.

Accordingly, even though the silver salt diffusion transfer method is used as such, the light-transmitting electromagnetic wave shielding material excellent in light transmittance and conductivity and advantageous for shielding the electromagnetic wave released from the image display surface in the electronic display device could not have been obtained.

DISCLOSURE OF THE INVENTION

The ordinary electromagnetic wave shielding material and process for producing the same have involved the problems respectively as stated above. Since an electromagnetic wave shielding plate in particular in which a mesh made of a metallic thin film is formed on a surface of a transparent glass or plastic substrate has quite a high electromagnetic wave shieldability and provides a good light transmittance, it has been used, in recent years, as an electromagnetic wave shielding material of a display panel for PDP or the like.

However, as the cost thereof is quite high, it has been strongly required to decrease the production cost. Moreover, since a high lightness of image is required for the display, it has been demanded that a light transmittance is approximately 100% and the color of the mesh is black. Nevertheless, when an opening rate (thin line-free portion of a mesh) occupied in the whole area is increased for improving the light transmittance, a conductivity is decreased to impair an electromagnetic wave shielding effect. For this reason, it has been so far quite difficult to improve the conductivity (electromagnetic wave shielding effect) and the light transmittance at the same time by the ordinary technique.

Under these circumstances, the invention has been made. It is an object of the invention to provide a light-transmitting electromagnetic wave shielding film which has a high electromagnetic wave shielding property and a high transparency at the same time and in which a mesh portion is black, and a process for producing a light-transmitting electromagnetic wave shielding film in which a thin line-like pattern can be formed by a short step and which can be mass-produced at low cost. Another object of the invention is to provide a light-transmitting electromagnetic wave shielding film for a plasma display panel using the light-transmitting electromagnetic wave shielding film obtained by the process and a plasma display panel using the same.

The present inventors have assiduously conducted investigations from the standpoint of minimizing the image quality deterioration of the PDP image while obtaining the high electromagnetic wave shielding property and the high transparency at the same time, and have consequently found that the above object can be attained effectively by the following light-transmitting electromagnetic wave shielding film and process for producing the same. This finding has led to the completion of the invention.

(1) A light-transmitting electromagnetic wave shielding film which is a conductive silver thin film with a metallic silver portion formed on a support in a meshy state, in which the metallic silver portion formed in the meshy state has a line width of 18 μm or less, an opening rate of 85% or more, an Ag content of 80 to 100% by mass and a surface resistance value of 5 Ω/sq or less.

(2) The light-transmitting electromagnetic wave shielding film according to (1), wherein a haze is 10% or less.

(3) The light-transmitting electromagnetic wave shielding film according to (1) or (2), wherein a light-transmitting portion formed of a portion other than the metallic silver portion of the conductive silver thin film has a transmittance in the entire visible region of 95% or more.

(4) A process for producing the light-transmitting electromagnetic wave shielding film according to any one of (1) to (3), which comprises exposing the silver salt-containing layer formed on the support to light in a meshy state and forming the metallic silver portion and the light-transmitting portion on an exposed portion and an unexposed portion respectively by conducting development.

(5) The process for producing the light-transmitting electromagnetic wave shielding film according to (4), wherein the metallic silver portion is substantially not subjected to physical development and/or plating.

(6) The process for producing the light-transmitting electromagnetic wave shielding film according to (4) or (5), wherein an Ag/binder volume ratio of the silver salt-containing layer is 1/2 or more.

(7) A light-transmitting electromagnetic wave shielding film for a plasma display panel, which comprises the light-transmitting electromagnetic wave shielding film according to the description of any one of (1) to (3).

(8) A plasma display panel having the light-transmitting electromagnetic wave shielding film according to the description of any one of (1) to (3).

The invention can provide the light-transmitting electromagnetic wave shielding film having a high electromagnetic wave shielding property and a high transparency, in which the mesh portion is black. Further, the invention can provide a process for producing a light-transmitting electromagnetic wave shielding film in which a thin line-like pattern can be formed by a short step, a high electromagnetic wave shielding property and a high transparency are provided and a mesh portion is black at a low cost and on a large scale. Still further, the invention can provide a light-transmitting electromagnetic wave shielding film for a plasma display panel using the light-transmitting electromagnetic wave shielding film obtained by the process, and a plasma display panel using the same.

BEST MODE FOR CARRYING OUT THE INVENTION

The light-transmitting electromagnetic wave shielding film and the process for producing the same in the invention are described in detail below.

In the present specification, "to" in the value is used to mean that the value described before or after this word is a lower limit or an upper limit.

<Light-Transmitting Electromagnetic Wave Shielding Film>

The light-transmitting electromagnetic wave shielding film of the invention is a conductive silver thin film in which a metallic silver portion is formed on a support in a meshy state, and the metallic silver portion formed in the meshy state is characterized in that a line width is 18 μm or less, an opening rate is 85% or more, Ar is contained in an amount of 80 to 100% by mass and a surface resistance value is 5 Ω/sp or less.

[Support]

In the invention, a plastic film, a plastic plate, a glass or the like can be used as the support.

As a starting material of the plastic film and the plastic plate, for example, polyesters such as polyethylene terephthalate (PET) and polyethylene naphthalate, polyolefins such as polyethylene (PE), polypropylene (PP), polystyrene and EVA, vinyl resins such as polyvinyl chloride and polyvinylidene chloride, polyether ether ketone (PEEK), polysulfone (PSF), polyether sulfone (PES), polycarbonate (PC), polyamide, polyimide and an acrylic resin and triacetyl cellulose (TAC) can be used.

In view of a transparency, a heat resistance, easy handling and a cost, it is preferable that the plastic film is a polyethylene terephthalate film.

Since the transparency is required for a electromagnetic wave shielding material for a display, the high transparency of the support is desirable. In this case, the transmittance in the entire visible region of the plastic film or the plastic plate is preferably 70 to 100%, more preferably 85 to 100%, especially preferably 90 to 100%. In the invention, the plastic film or the plastic plate which is colored to such an extent that the object of the invention is not impaired may be used as the support.

The plastic film or the plastic plate which can be used as the support in the invention may be used as a single layer or as a multilayer film which is a combination of two or more layers.

When the glass plate is used as the support in the invention, its type is not particularly limited. However, when it is used in an electromagnetic wave shield for display, it is advisable to use a reinforced glass with a reinforcing layer formed on the surface. The reinforced glass has a high possibility of preventing breakage in comparison with the use of a non-reinforced glass. Further, even when a reinforced glass obtained by an air cooling method is broken, the broken pieces are small and the end surfaces thereof are not sharp. Thus, it is desirable in view of a safety.

[Metallic Silver Portion (Conductive Metallic Portion)]

The conductive metallic portion in the invention is described below.

In the invention, the metallic silver portion plays a part of a conductive metallic portion. The metallic silver portion can be formed by subjecting the silver salt-containing layer to exposure and development, and the metallic silver portion is formed on the exposed portion.

In view of preventing the conductive metallic portion (metallic silver portion) from being oxidized and discolored over the course of time in the invention, it is advisable to subject the metallic silver portion to treatment of preventing discoloration. For this treatment, the use of an anticorrosion agent applied to a metal surface or the like is mentioned. As the anticorrosion agent, a mercapto compound or the like can be utilized.

The metallic silver portion in the invention has the good conductivity. The surface resistance value of the metallic silver portion in the invention is 5 Ω/sq or less, more preferably 2.5 Ω/sq or less, most preferably 1 Ω/sq or less. Incidentally, in the invention, the lower the surface resistance value, the better, and the lower limit is not particularly limited. It is usually 0.01 Ω/sq or more.

For obtaining the good conductivity, the metallic silver portion in the invention contains Ag in an amount of 80 to 100% by mass, preferably 90 to 100% by mass, more preferably 95 to 100% by mass. Thus, the light-transmitting electromagnetic wave shielding film of the invention has the metallic silver portion with the high Ag content, making it possible to secure the good conductivity and control the surface resistance value at the low level. Further, since silver is used as the conductive metal in the invention, the mesh of the light-transmitting electromagnetic wave shielding film can be black. Accordingly, when the film is used in a plasma display panel or the like, the decrease in contrast of the image can-be prevented.

The metallic silver portion in the invention takes the meshy form. It is advisable that the form comprises a triangle such as a regular triangle, an isosceles triangle or a right-angled triangle, a square such as a regular square, a rectangle, a rhomb, a parallelogram or a trapezoid, a (regular) polygon with n angles such as a (regular) hexagon or a (regular) octagon or a geometrical pattern of a combination of a circle, an ellipse, a star shape and the like. In view of the electromagnetic wave shielding property, the triangle form is most effective. In view of the visible light transmittance, the larger the n-number of the (regular) n-angle, the higher the opening rate in the same line width, and the visible light transmittance is advantageously increased.

In the use of the light-transmitting electromagnetic wave shielding film, when the line width of the metallic silver portion can be estimated in visually observing the mesh shape, a problem arises. Accordingly, it is required for use in PDP that the line is too thin to be estimated. In the invention, the line width of the metallic silver portion is 18 μm or less, preferably 3 μm to 14 μm, more preferably 3 μm to 10 μm. Incidentally, that the line width of the metallic silver portion is 18 μm or less in the invention does not necessarily mean that all of the line widths are 18 μm or less, but it means that 60% or more (preferably 80% or more) of all the line widths are 18 μm or less. For this reason, when there is a portion whose line width partially exceeds 18 μm but 60% or more of all of the line widths are 18 μm or less, the effect of the invention can be brought forth.

In view of the image quality of moire or the like, it is advisable that the film thickness of the metallic silver portion in the invention is small. For securing the conductivity, the film thickness is preferably 2.5 μm or more, more preferably 2.5 μm to 8 μm, further preferably 2.5 μm or more but less than 5 μm, furthermore preferably 2.5 μm to 4 μm.

The pitch of the metallic silver portion in the invention is preferably 60 μm to 450 μm, more preferably 120 μm to 400 μm.

The metallic silver portion has a part whose line width is larger than 20 μm for the purpose of ground connection or the like.

In the metallic silver portion of the invention, in view of the visible light transmittance, the opening rate is 85% or more, preferably 90% or more, most preferably 93% or more. The "opening rate" of the metallic silver portion in the invention is a rate at which the thin line-free portion (space) of the metallic silver portion being a mesh occupies the whole area. For example, an opening rate of a regular square lattice mesh having a line width of 10 μm and a pitch of 200 μm is 90%.

With respect to the opening rate of the metallic silver portion in the invention, the upper limit is not particularly limited. However, in connection with the surface resistance value and the line width value, the opening rate is preferably 98% or less.

The lower the haze of the light-transmitting electromagnetic wave shielding film in the invention, the better. This is because when the haze is higher, the PDP image becomes dimmer. In the invention, the haze of the light-transmitting electromagnetic wave shielding film is preferably 10% or less, more preferably 5% or less, further preferably 3% or less, furthermore preferably 2% or less, most preferably 1% or less.

[Light-transmitting Portion]

The "light-transmitting portion" in the invention means a portion having a transparency except the conductive metallic portion (metallic silver portion) in the light-transmitting electromagnetic wave shielding film.

The light-transmitting portion has a transmittance in the entire visible region of 95% or more, preferably 97% or more, most preferably 99% or more.

The "transmittance in the entire visible region" in the invention refers to, unless otherwise instructed, a transmittance expressed by an average transmittance in a wavelength region of 380 to 780 nm except contribution of light absorption or reflection of a support. The transmittance in the entire visible region in the invention is expressed by (transmittance in the entire visible region of light-transmitting electromagnetic wave shielding material)/(transmittance in the entire visible region of support)×100 (%). In the embodiment of the invention, it is approximately equal to the opening rate.

In the invention, it is advisable that the light-transmitting portion is substantially free from a physical development nucleus in view of improving the transmittance. In the invention, unlike an ordinary silver complex salt diffusion transfer method, it is unnecessary that the diffusion is conducted after dissolving an unexposed silver halide to convert it to a soluble silver complex compound. Accordingly, the light-transmitting portion is substantially free from the physical development nucleus.

The "substantially free from the physical development nucleus" here referred to means that the existence rate of the physical development nucleus in the light-transmitting portion is in the range of 0 to 5%.

The light-transmitting portion in the invention is formed along with the metallic silver portion by subjecting the silver salt-containing layer to exposure and development.

[Layer Structure of the Light-Transmitting Electromagnetic Wave Shielding Film]

The thickness of the support in the light-transmitting electromagnetic wave shielding film of the invention is preferably 5 to 200 μm, more preferably 30 to 150 μm. In the range of 5 to 200 μm, the desired visible light transmittance is obtained, and handling is also easy.

The metallic silver portion is formed of one layer or two or more layers. When the metallic silver portion is in a pattern mode and formed of two or more layers, different color sensitivities can be imparted such that sensitization is possible with different wavelengths. Thus, when exposure is conducted by varying the exposure wavelength, different patterns can be formed in respective layers.

Regarding the application to the electromagnetic wave shielding material of the display, the smaller thickness of the metallic silver portion as the conductive metallic portion is preferable because the visual angle of the display is widened. Further, regarding the application to the conductive wiring material, the thinner film is required from the demand for higher density.

In the invention, the metallic silver portion having the desired thickness can be formed by controlling the coating thickness of the silver salt-containing layer. Accordingly, the light-transmitting electromagnetic wave shielding film having the thickness of less than 5 μm, preferably less than 3 μm can easily be formed.

[Functional Film Other Than an Electromagnetic Wave Shield]

In the invention, functional layers having desired functions maybe formed separately as required. The functional layers can be provided in various manners according to the usages. For example, with respect to the usage of an electromagnetic wave shielding material for a display, it is possible to provide an antireflection layer having an antireflection function with a refractive index or a film thickness adjusted; a non-glare layer or an antiglare layer (both layers have a function of preventing glare); a near-infrared absorption layer made of a compound or a metal that absorbs near-infrared rays; a layer having a color tone adjusting function which absorbs a visible light in a specific wavelength region; an antifouling layer having a function of easily removing a dirt such as a finger print; a hard coating layer which is difficult to damage; a layer having a shock absorbing function; a layer having a function of preventing a glass from being scattered at the time of breaking it; and the like. These functional layers may be located on the opposite side with the silver salt-containing layer and the support between or on the same side.

These functional films may directly be adhered to PDP or a transparent substrate such as a glass plate or an acrylic resin plate separately from a plasma display panel body. These functional films are called an optical filter (or simply a filter).

The antireflection layer having the function of preventing reflection maybe formed, for inhibiting the decrease in contrast upon controlling the reflection of external light, by a method in which an inorganic substance such as a metal oxide, fluoride, silicate, borate, carbide, nitride or sulfide is laminated as a single layer or a multilayer by vacuum deposition, sputtering, ion plating, ion beam assisting or the like, a method in which a resin different in refractive index, such as an acrylic resin or a fluororesin is laminated in a single layer or a multilayer, or the like. A film subjected to antireflection treatment may be adhered to the filter. A non-glare layer or an antiglare layer may be formed as required. The non-glare layer or the antiglare layer can be formed by a method in which, for example, a silica, melamine or acrylic fine powder is formed into ink which is coated on the surface. The ink can be cured by heat curing, photocuring or the like. Further, a film subjected to non-glare treatment or antiglare treatment may be adhered to the filter. A hard coating layer may be formed as required.

Examples of the near-infrared absorption layer can include a layer containing a near-infrared absorption dye such as a metal complex compound, a silver sputtering layer and the like. The silver sputtering layer may cut light of 1,000 nm or more ranging from near-infrared rays and far-infrared rays to an electromagnetic wave by alternatively laminating a dielectric layer and a metallic layer on a substrate via sputtering or the like. Examples of the dielectric substance contained in the dielectric layer include transparent metal oxides such as indium oxide and zinc oxide, and the like. As the metal contained in the metallic layer, silver or a silver-palladium alloy is general. The silver sputtering layer has usually a structure obtained by laminating three layers, five layers, seven layers or eleven layers starting from the dielectric layer.

A fluorescent material provided in PDP to emit blue light has a property of emitting red light other than the blue light, though slightly. Accordingly, there is a problem that a portion to be displayed in blue color is displayed in purplish color. The layer with the function of adjusting the color tone in which the visible light in the specific wavelength region is absorbed is a layer that corrects the color light for coping with this problem, and it contains a dye that absorbs light of approximately 595 nm.

[Process for Producing an Electromagnetic Wave Shielding Film for PDP]

A process for producing an electromagnetic wave shielding film for PDP in the invention is described below.

As the process for producing the light-transmitting electromagnetic wave shielding film in the invention, any of the following processes can be employed.

(a) Process which comprises obtaining a metallic silver meshy portion by electroplating, and then transferring the metallic silver meshy portion on a transparent support to obtain the light-transmitting electromagnetic wave shielding film of the invention.

(b) Process which comprises forming a meshy pattern of an electroless plating catalyst on a support, and then conducting electroless plating to form a metallic silver meshy portion and obtain the light-transmitting electromagnetic wave shielding film of the invention.

(c) Process which comprises forming a meshy pattern with a conductive silver paste to form the light-transmitting electromagnetic wave shielding film of the invention.

(d) Process which comprises exposing a silver salt-containing layer formed on a substrate to light, conducting development to form a metallic silver portion on the exposed portion and forming a light-transmitting portion on the unexposed portion to obtain the light-transmitting electromagnetic wave shielding film of the invention.

(e) Process which comprises etching a metallic thin film on a support.

Among the foregoing processes, the process in (a) is a process in which after forming a resist pattern on a metallic plate, a conductive metallic thin meshy film (metallic silver portion) is formed on the metallic plate by electroplating and is transferred on an adhesive film having an adhesive agent.

The process in (b) is a process in which a meshy pattern of an electroless plating catalyst such as a palladium catalyst is formed on a support by various printing methods or the like, and electroless plating is conducted to form a metallic silver meshy portion.

The process in (c) is a process in which a metallic silver meshy portion is formed on a substrate by various printing methods or the like using a conductive silver paste.

The process in (d) is a preferable process on the light-transmitting electromagnetic wave shielding film of the invention, and is described in detail below.

The process in (e) is a process in which a metallic thin film containing uniform silver is formed on a support, a resist pattern is formed thereon and a metallic thin meshy film (metallic silver portion) is then obtained by etching. The etching method includes a wet etching method using an oxidizing agent-containing etching solution (chemical etching method). Further, a dry etching method can be mentioned.

The light-transmitting electromagnetic wave shielding film of the invention is preferably produced by the process in (d) (hereinafter, this process is referred to as the "process of the invention"). This process is described in detail below.

The process of the invention is a process for producing the light-transmitting electromagnetic wave shielding film in the invention, which comprises exposing the silver salt-containing layer formed on the support to light, conducting development to form a metallic silver portion on an exposed portion and a light-transmitting portion on an unexposed portion.

[Silver salt-containing layer]

In the process of the invention, the silver salt-containing layer is formed on the support as an optical sensor. The silver salt-containing layer may contain, in addition to the silver salt, a binder, a solvent and the like.

<Silver salt>

Examples of the silver salt used in the invention include inorganic silver salts such as a silver halide and organic silver salts such as silver acetate. It is preferable to use a silver halide excellent in properties as an optical sensor.

The silver halide preferably used in the invention is further described.

As described above, the silver halide can be used in the invention for the layer to serve as the optical sensor. The technique used in a silver salt photographic film, a printing paper, a film for a printing plate, an emulsion mask for a photomask or the like on a silver halide can directly be used in the invention also.

A halogen element contained in the silver halide may be any of chlorine, bromine, iodine and fluorine, or a combination thereof. For example, a silver halide made mainly of AgCl, AgBr or AgI is preferably used. A silver halide made mainly of AgBr is more preferably used.

The "silver halide made mainly of AgBr" as described herein refers to a silver halide in which the molar ratio of a bromide ion occupied in a silver halide composition is 50% or more. The particles of the silver halide made mainly of AgBr may contain, in addition to the bromide ion, an iodide ion and a chloride ion.

The silver halide is in the form of solid particles. In view of the image quality of the patterned metallic silver layer formed after exposure and development, the average particle size of the silver halide is preferably 0.1 to 1,000 nm (1 μm), more preferably 0.1 to 100 nm, further preferably 1 to 50 nm in terms of a sphere-equivalent diameter.

The sphere-equivalent diameter of the silver halide particles is a diameter of particles in the spherical form with the same volume.

The formof the silver halide particles is not particularly limited. It caninclude various formssuch asa spherical form, a cubic form, a flat form (a hexagonal flat form, a triangular flat form, a square flat form or the like), an octahedral form and a tetradecahedral form.

The silver halide used in the inventionmay further contain other elements. For example, it is useful to dope a metallic ion used to obtain a hard emulsion as a photographic emulsion. Especially a transition metal ion such as a rhodium ion or an iridium ion is preferably used because a difference between an exposed portion and an unexposed portion is clearly provided in forming a metallic silver image. The transition metal ions typified by a rhodium ion and an iridium ion may be compounds having various ligands. Examples of the ligands include a cyanide ion, a halogen ion, a thiocyanate ion, a nitrosyl ion, water, a hydroxide ion and the like. Specific examples of the compounds include $K_3Rh_2Br_9$, $K_2IrCl_6$ and the like.

In the invention, the content of the rhodium compound and/or the iridium compound contained in the silver halide is preferably $10^{-10}$ to $10^{-2}$ mol/mol of Ag, more preferably $10^{-9}$ to $10^{-3}$ mol/mol of Ag relative to the molar number of silver of the silver halide.

Further, in the invention, a silver halide containing a Pd (II) ion and/or a Pd metal can desirably be used. Pd may uniformly be distributed within the silver halide particles. However, it is advisable that Pd is contained in the vicinity of the surface layers of the silver halide particles. That "Pd is contained in the vicinity of the surface layers of the silver halide particles" as described herein means that a layer having a higher palladium content than other layers is provided within 50 nm in the depth direction from the surfaces of the silver halide particles. Such silver halide particles can be formed by adding Pd during formation of the silver halide particles. It is advisable to add Pd after the silver ion and the halogen ion are added in an amount of 50% or more based on the total addition amount. It is also advisable that the Pd (II) ion is caused to exist in the silver halide surface layer by a method in which it is added at the time of after-maturing.

The Pd-containing silver halide particles increase the rate of physical development or electroless plating and raise the production efficiency of the desired electromagnetic wave shielding material to contribute toward the reduction in productioncost.  Pdhasbeenwellknownasanelectrolessplating catalyst. In the invention, since Pd can be unevenly localized on the surface layers of the silver halide particles, it is possible to save quite costly Pd.

In the invention, the content of the Pd ion and/or the Pd metal contained in the silver halide is preferably $10^{-4}$ to 0.5 mol/mol of Ag, more preferably 0.01 to 0.3 mol/mol of Ag relative to the molar number of silver of the silver halide.

Examples of the Pd compound used include $PdCl_4$, $Na_2PdCl_4$ and the like.

In the invention, for improving a sensitivityof an optical sensor, chemical sensitization with a photographic emulsion may be conducted. As the chemical sensitization, for example, noble metal sensitization such as gold sensitization, chalcogen sensitization such as sulfur sensitization, reductive sensitization or the like can be utilized.

As the emulsion available in the invention, for example, an emulsion for a color negative film described in Examples of gazette of JP-A-11-305396, gazette of JP-A-2000-321698, gazette of JP-A-13-281815 and gazette of JP-A-2002-72429, an emulsion for a color reversal film described in gazette of JP-A-2002-214731 and an emulsion for a color printing paper described in JP-A-2002-107865 can advantageously be used.

<Binder>

In the silver salt-containing layer in the process of the invention, a binder can be used to uniformly disperse the silver salt particles and aid in adhesion between the silver salt-containing layer and the support. In the invention, both of a water-insoluble polymer and a water-soluble polymer can be used as a binder. It is preferable to use the water-soluble polymer.

Examples of the binder include polysaccharides such as gelatin, polyvinyl alcohol (PVA), polyvinyl pyrrolidone (PVP) and starch, cellulose and derivatives thereof, polyethylene oxide, polysaccharides, polyvinylamine, chitosan, polylysine, polyacrylic acid, polyarginic acid, polyhyaluronic acid, carboxycellulose and the like. These have a neutrality, an anionicity or a cationicity depending on an ionicity of a functional group.

The content of the binder contained in the silver salt-containing layer in the process of the invention can properly be determined within such a range that a dispersibility and an adhesion can be exhibited. For the metallic particles to be easily contacted with each other to provide a high conductivity, the content of the binder in the silver salt-containing layer is preferably 1/2 to 2, more preferably 1/1 to 2 in terms of an Ag/binder volume ratio.

<Solvent>

A solvent used in the silver salt-containing layer in the process of the invention is not particularly limited. Examples thereof can include water, organic solvents (for example, alcohols such as methanol, ketones such as acetone, amides such as formaldehyde, sulfoxides such as dimethyl sulfoxide, esters such as ethyl acetate and ethers), an ionic liquid, and a mixed solvent thereof.

The content of the solvent used in the silver salt-containing layer of the invention is in the range of 30 to 90% by mass, preferably 50 to 80% by mass based on the total amount of the silver salt, the binder and the like contained in the silver-containing layer.

[Exposure]

In the process of the invention, the exposure of the silver salt-containing layer formed on the support is conducted. The exposure can be conducted using an electromagnetic wave. Examples of the electromagnetic wave include lights such as visible light and ultraviolet light, radioactive rays such as X-rays, and the like. In the exposure, a light source having a wavelength distribution may be utilized, and a light source having a specific wavelength may be used.

As the light source, for example, scanning exposure using a cathode ray tube (CRT) can be mentioned. A cathode ray tube exposure device is simple and compact in comparison with a device using a laser, which leads to the low cost. Further, it is easy to adjust optical axis or color. In a cathode ray tube used in image exposure, various light-emitting materials that emit light in a spectral region are used as required. As the light-emitting material, for example, one or a combination of two or more of a red light-emitting material, a green light-emitting material and a blue light-emitting material is used. The spectral region is not limited to the red, green or blue region, and a fluorescent material that emits light in a yellow, orange, purple or infrared region is also used. Especially, a cathode ray tube that emits white light by mixing these light-emitting materials is often used. Further, an ultraviolet lamp is desirable, and g-beam or i-beam of a mercury lamp and the like are also used.

In the process of the invention, the exposure can be conducted using various laser beams. In the exposure of the invention, for example, a scanning exposure method with high-density monochromic light of a gas laser, a light-emitting diode, a semiconductor laser or a second harmonic generation light source (SHG) which is a combination of a semiconductor laser or a solid state laser using a semiconductor laser as an excitation light source with a non-linear optical crystal can preferably be used. Further, a KrF excimer laser, an ArF excimer laser, an F2 laser or the like is also available. For the system to be compact and less costly, the exposure is preferably conducted using a semiconductor laser or a second harmonic generation light source (SHG) which is a combination of a semiconductor laser or a solid state laser with a non-linear optical crystal. Especially for designing a device which is compact, less costly, long in life and high in stability, it is preferable to conduct the exposure using a semiconductor laser.

As a laser light source, specifically, a blue semiconductor laser with a wavelength of 430 to 460 nm (made public by Nichia Kagaku inthe 48th *Oyo Butsurigaku Kankei Rengo Koshukai* on March 2001), a green laser with approximately 530 nm which is taken out by converting a wavelength of a semiconductor laser (oscillation wavelength approximately 1,060 nm) with SHG crystal of $LiNbO_3$ having a waveguide inversion domain structure, a red semiconductor laser with a wavelength of approximately 685 nm (Hitachi Type No. HL6738 MG), a red semiconductor laser with a wavelength of approximately 650 nm (Hitachi Type No. HL6501 MG) or the like is preferably used.

A method in which the silver salt-containing layer is exposed to light in a patterned state may be conducted by surface exposure using a photomask or by scanning exposure with a laser beam. At this time, refractive exposure with a lens or a reflective exposure with a reflector is available. Exposure system such as contact exposure, proximity exposure, reduced projection exposure or reflective projection exposure can be used.

[Development]

In the process of the invention, development is further conducted after exposing the silver salt-controlling layer to light.

In the development, an ordinary technique of development used for a silver salt photographic film, a printing paper, a film for a printing plate, an emulsion mask for a photomask and the like can be employed. A developing solution is not particularly limited, and a PQ developing solution, an MQ developing solution, an MAA developing solution and the like can be used. As a commercial product, developing solutions such as CN-16, CR-56, CP45X, FD-3 and Papitol manufactured by Fuji Film, C-41, E-6, RA-4, Dsd-19 and D-72 manufactured by Kodak or developing solutions contained in kits thereof are available. Further, a lith developing solution is also available. As the lith developing solution, D85 manufactured by Kodak or the like can be used.

In the process of the invention, the exposure and the development are conducted to form a patterned metallic silver portion on an exposed portion and a light-transmitting portion to be described later on an unexposed portion.

The development in the process of the invention can include fixation which is conducted for stabilization by removing the silver salt of the unexposed portion. As the fixation in the process of the invention, a technique of fixation used for a silver salt photographic film, a printing paper, a film for a printing plate, an emulsion mask for a photomask and the like can be employed.

The developing solution used in the development can contain an image quality improver for improving the image quality. Examples of the image quality improver can include nitrogen-containing heterocyclic compounds such as benzotriazole. When the lith developing solution is used, it is also advisable to use polyethylene glycol in particular.

The amount of the metallic silver contained in the exposed portion after development is preferably 50% by mass or more, more preferably 80% by mass or more based on the amount of silver contained in the exposed portion before exposure. It is preferable that the amount of silver contained in the exposed portion is 50% by mass or more based on the amount of silver contained in the exposed portion before exposure, because a high conductivity is easily obtained.

The gradation after development in the invention is not particularly limited. Preferably, it exceeds 4.0. When the gradation after development exceeds 4.0, the conductivity of the conductive metallic portion can be increased while keeping high the transparency of the light-transmitting portion. As a method in which the gradation is setat 4.0 or more, for example, doping of the rhodium ion or the iridium ion is mentioned.

[Oxidation]

In the process of the invention, the metallic silver portion after development is preferably oxidized. The oxidation makes it possible to remove the metal when slightly deposited on the light-transmitting portion, so, that the transmittance of the light-transmitting portion can be approximately 100%.

In the oxidation, a known method using various oxidizing agents, such as treatment with an Fe(III) ion is mentioned. The oxidation can be conducted after exposure or development of the silver salt-containing layer.

In the invention, the metallic silver portion after exposure and development may be treated with a Pd-containing solution. Pd may be either a divalent palladium ion or metallic palladium. This treatment makes it possible to suppress the change of the black color in the metallic silver portion over the course of time.

In the process of the invention, the metallic silver meshy portion with the line width, the opening rate and the Ag content specified is directly formed on the support by exposure and development to provide the satisfactory surface resistance value. Accordingly, there is no need to freshly impart a conductivity by subjecting the metallic silverportion to physical development and/or plating. For this reason, the light-transmitting electromagnetic wave shielding film can be produced by a simple step.

As stated above, the light-transmitting electromagnetic wave shield of the invention can advantageously be used as a light-transmitting electromagnetic shielding film for a plasma display panel. Therefore, the plasma display panel formed with the light-transmitting electromagnetic wave shielding film for the plasma display panel containing the light-transmitting electromagnetic wave shielding film of the invention has the high electromagnetic wave shieldability, the high contrast and the high lightness and can be produced at low cost.

The invention is illustrated more specifically below by referring to Examples of the invention. The materials, the amounts, the rates, the treatment contents, the treatment order and the like described in the following Examples can properly be changed unless the gist of the invention is deviated. Accordingly, the scope of the invention is not to be interpreted limitatively by the following concrete examples.

EXAMPLES 1 AND 2

An emulsion containing 4.6 g of gelatin per 60 g of Ag in an aqueous medium and silver chlorobromide particles having a sphere-equivalent average diameter of 0.09 µm was prepared. The Ag/gelatin volume ratio of the emulsion was 1/0.6. As the gelatin series, low-molecular gelatin having an average molecular weight of 20,000, high-molecular gelatin having an average molecular weight of 100,000 and oxidized gelatin having an average molecular weight of 100,000 were mixed and used.

$K_3Rh_2Br_9$ and $K_2IrCl_6$ were added to the emulsion, and the silver bromide particles were doped with an Rh ion and an Ir ion. Subsequently, $Na_2PdCl_4$ was further added to the emulsion, and gold sulfur sensitization was further conducted using chloroauric acid and sodium thiosulfate. After the sensitization, the emulsion was coated on polyethylene terephthalate (PET) along with a gelatin hardening agent such that the coating amount of silver became 15 $g/m^2$, and was then dried. PET which had been hydrophilized before coating was used.

Then, the dried coated film was exposed to parallel light using ahigh-pressure mercury lamp as a light source via a lattice photomask (photomask having a lattice space with line/space=195 µm/5 µm (pitch 200 µm)) capable of forming a developed silver image with line/space=5 µm/195 µm on the dried coated film, developed with the following developing solution, further treated with a fixing solution (trade name: N3X-R for CN16X: manufactured by Fuji Photo Film Co., Ltd.), and then rinsed with pure water to obtain samples A and B of the invention different in line width and opening rate.

[Composition of a developing solution]

The following compounds are contained in 1 liter of a developing solution.

| | |
|---|---|
| hydroquinone | 0.037 mol/L |
| N-methylaminophenol | 0.016 mol/L |
| sodium metaborate | 0.140 mol/L |
| sodium hydroxide | 0.360 mol/L |
| sodium bromide | 0.031 mol/L |
| potassium metabisulfite | 0.187 mol/L |

COMPARATIVE EXAMPLES 1 to 4

—Production of comparative samples—

For comparison with a technique having the highest conductivity and light transmittance among known techniques, a sample of Comparative Example 1 was produced in the following manner according to a method for producing a metallic mesh as described in JP-A-10-41682 as a typical example of the foregoing prior art column "Etched Copper Mesh using Photography". That is, an electrolytic copper foil having a thickness of 18 µm was first adhered to a transparent PET film having a thickness of 50 µm via an epoxy-type adhesive sheet (Nika Flex SAF; manufactured by Nikkan Kogyo K.K.) as an adhesive layer under conditions of 180° C. and 30 kgf/$cm^2$ by heat lamination. At this time, the roughened surface of the electrolytic copper foil was located on the side of the epoxy-type adhesive sheet. The resulting PET film with the copper foil was subjected to photolithography (resist film adhesion-exposure-development-chemical etching-resist film peeling) using a photomask with a pitch of 200 µm as in Examples 1 and 2 to provide a mesh form.

A sample of Comparative Example 2 was produced in the following manner according to a method for producing a metallic mesh as described in Example 3 of JP-B-42-23745 as a typical example of a silver salt diffusion transfer method in which silver is deposited on a physical development nucleus as "Method for Forming Conductive Silver using Silver Salt" in the foregoing prior art column. That is, TAC (triacetyl cellulose) manufactured by Fuji Photo Film Co., Ltd. was hydrophilized by easy adhesion treatment. A solution comprising 0.2% AgNO$_3$ (10 ml), 1% KBr (1 ml), 2% formalin (10 ml) and 0.03 mol/L NaOH (100 ml) and a solution comprising gelatin (3 g) and water (100 ml) were mixed. After salts and the like were removed by dialysis, the total amount was adjusted to 500 ml. The solution in the coating amount of 100 g/m$^2$ (equivalent to 0.004 g/m$^2$ as Ag) was coated on hydrophilized TAC, and dried to form a physical development nucleus layer. A silver chloride emulsion was further coated thereon, and dried to form a photosensitive layer. The exposure was conducted via a meshy photomask with a pitch of 200 μm, and development was conducted by a DTR method to produce a sample.

Samples of Comparative Examples 3 and 4 different in opening rate were produced in the following manner according to a method for producing a metallic mesh as described in gazette of JP-A-2000-13088 as a typical example of "Mesh with Silver Paste Printed" in the foregoing prior art column. That is, a silver paste meshy pattern shown in Table 1 was first formed on a surface of a polyethylene terephthalate (PET) film (manufactured by Toyobo Co., Ltd., trade name A-4100) having a thickness of 50 μm using an intaglio offset printing method. Thereafter, a conductive paste resin was heat-cured at 150° C. for 3 hours to produce an electromagnetic wave shielding film.

(Evaluation)

The line width of the conductive metallic portions of the samples having the conductive metallic portion and the light-transmitting portion in the invention and Comparative Examples was measured to obtain the opening rate. The surface resistance value was further measured. Incidentally, in each measurement, an optical microscope, a scanning electron microscope and a low resistivity meter were used.

The color of the metallic portion of the mesh was visually estimated. A black color was defined as "o", and a brown or gray color as "x". Further, regarding the number of steps in the process, the number of steps which was 5 or less was defined as "o", and the number of steps which exceeds 5 was defined as x".

The results of evaluation are shown in the following table along with the data of comparative samples.

the large line width. Further, this mesh, like the mesh with the silver paste printed in Comparative Example 6, could increase the opening rate by widening the pitch. However, in this case, the surface resistance value became large.

On the other hand, the samples of the invention (Examples 1 and 2) are free from the problems in these Comparative Examples, and have the small line width, the high opening rate and the small surface resistance value (the electromagnetic wave shieldability is high). Further, since the metallic portion of the mesh is black, an adverse effect on the image of the display (decrease in contrast) is avoided. Moreover, the number of steps in the production was small.

INDUSTRIAL APPLICABILITY

The light-transmitting electromagnetic wave shielding film of the invention has the high electromagnetic shielding property and the high transparency at the same time, and the mesh portion is black. Further, the process of the invention can mass-produce the light-transmitting electromagnetic wave shielding film having such characteristics efficiently at low cost. The light-transmitting electromagnetic wave shielding film provided by the invention is effectively used for the plasma display panel and the like. Accordingly, the industrial applicability of the invention is high.

The invention claimed is:

1. A process for producing a light-transmitting electromagnetic wave shielding film which is a conductive silver thin film with a metallic silver portion formed on a support in a meshy state, in which the metallic silver portion formed in the meshy state comprises silver and a binder and has a line width of 18 μm or less, an opening rate of 85% or more, a silver content of at least 80% by mass, and a surface resistance value of 5 Ω/sq or less, which comprises exposing a silver salt-containing layer formed on the support to light in a meshy state and forming a metallic silver portion and a light-transmitting portion on an exposed portion and an unexposed portion respectively by conducting development.

2. The process for producing the light-transmitting electromagnetic wave shielding film according to claim 1, wherein the silver salt is a silver halide.

TABLE 1

| | Sample | Line width (μm) | Opening rate (%) | Surface resistance (Ω/sq.) | Color | Number of steps | Remarks |
|---|---|---|---|---|---|---|---|
| Example 1 | Sample A | 15 | 86 | 1 | o | o | Invention |
| Example 2 | Sample B | 9 | 91 | 2 | o | o | Invention |
| Comparative Example 1 | Tracing test of JP-A-10-41682 | 12 | 88 | 0.1 | x | x | Comparative Example (copper mesh by Etching) |
| Comparative Example 2 | Tracing test of JP-B-42-23745 | 15 | 86 | 90 | x | o | Comparative Example (silver salt) |
| Comparative Example 3 | Tracing test of JP-A-2000-13088 | 20 | 81 (pitch 200 μm) | 5 | o | o | Comparative Example |
| Comparative Example 4 | | 20 | 87 (pitch 200 μm) | 9 | o | o | (silver paste printing) |

As is apparent from Table 1, the color of the mesh in the etched copper mesh of Comparative Example 3 was brown, and the number of steps was large. Further, the mesh using the silver salt in Comparative Example 4 was large in surface resistance value, and the electromagnetic wave shieldability was insufficient. In the mesh with the silver paste printed in Comparative Example 5, the opening rate was low because of 3. The process for producing the light-transmitting electromagnetic wave shielding film according to claim 1, wherein the silver salt is a silver halide made mainly of AgBr.

4. The process for producing the light-transmitting electromagnetic wave shielding film according to claim 2, wherein an average particle size of the silver halide is 0.1 to 1,000 nm in terms of a sphere-equivalent diameter.

5. The process for producing the light-transmitting electromagnetic wave shielding film according to claim 1, wherein the silver-containing layer contains rhodium or iridium.

6. The process for producing the light-transmitting electromagnetic wave shielding film according to claim 1, wherein the silver-containing layer contains gelatin as a binder.

7. The process for producing the light-transmitting electromagnetic wave shielding film according to claim 1, wherein an Ag/binder volume ratio of the silver salt-containing layer is 1/2 or more.

8. The process for producing the light-transmitting electromagnetic wave shielding film according to claim 1, wherein the metallic silver portion is substantially free from physical development and/or plating.

9. A method for producing a conductive silver thin film comprising a metallic silver portion formed on a support in a meshy state, in which the metallic silver portion formed in the meshy state comprises silver and a binder and has a line width of 18 μm or less, an opening rate of 85% or more, a silver content of at least 80% by mass, and a surface resistance value of 5 Ω/sq or less, which comprises exposing a silver salt-containing layer formed on the support to light in a meshy state and forming a metallic silver portion and a light-transmitting portion on an exposed portion and an unexposed portion respectively by conducting development.

10. The process for producing the conductive silver thin film according to claim 9, wherein the silver salt is a silver halide.

11. The process for producing the conductive silver thin film according to claim 9, wherein the silver salt is a silver halide made mainly of AgBr.

12. The process for producing the conductive silver thin film according to claim 10, wherein an average particle size of the silver halide is 0.1 to 1,000 nm in terms of a sphere-equivalent diameter.

13. The process for producing the conductive silver thin film according to claim 9, wherein the silver-containing layer contains rhodium or iridium.

14. The process for producing the conductive silver thin film according to claim 9, wherein the silver-containing layer contains gelatin as a binder.

15. The process for producing the conductive silver thin film according to claim 9, wherein an Ag/binder volume ratio of the silver salt-containing layer is 1/2 or more.

16. The process for producing the conductive silver thin film according to claim 9, wherein the metallic silver portion is substantially free from physical development and/or plating.

* * * * *